(12) United States Patent
Watanabe et al.

(10) Patent No.: US 9,887,284 B1
(45) Date of Patent: Feb. 6, 2018

(54) SEMICONDUCTOR DEVICE

(71) Applicant: Mitsubishi Electric Corporation, Tokyo (JP)

(72) Inventors: Shinsuke Watanabe, Tokyo (JP); Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/493,299

(22) Filed: Apr. 21, 2017

(30) Foreign Application Priority Data

Oct. 6, 2016 (JP) .................. 2016-198125

(51) Int. Cl.
*H01L 29/78* (2006.01)
*H01L 23/00* (2006.01)
*H01L 23/31* (2006.01)
*H01L 29/20* (2006.01)

(52) U.S. Cl.
CPC .......... *H01L 29/78* (2013.01); *H01L 23/3107* (2013.01); *H01L 24/09* (2013.01); *H01L 24/16* (2013.01); *H01L 29/20* (2013.01); *H01L 29/2003* (2013.01); *H01L 2924/13091* (2013.01)

(58) Field of Classification Search
CPC ............. H01L 29/78; H01L 2924/1207; H01L 2924/19043; H01L 29/7408; H01L 27/1112; H01L 29/7304; H01L 2225/06541; H01L 24/10; H01L 24/12; H01L 24/13; H01L 24/14; H01L 24/15; H01L 24/16; H01L 24/17; H01L 23/62; H01L 29/0607
See application file for complete search history.

(56) References Cited

U.S. PATENT DOCUMENTS

| 6,046,481 A * | 4/2000 | Ishikura | ............... H01L 27/0211 257/338 |
| 7,893,489 B2 * | 2/2011 | Kobayashi | ........ H01L 29/41766 257/331 |
| 8,361,865 B2 * | 1/2013 | Kobayashi | ........ H01L 29/41766 257/E21.419 |
| 8,921,186 B2 * | 12/2014 | Shea | .................... H01L 29/1095 438/286 |
| 9,607,930 B2 * | 3/2017 | Janzen | .................. H01L 23/481 |

(Continued)

FOREIGN PATENT DOCUMENTS

| JP | H11-297941 A | 10/1999 |
| JP | 2008277365 A * | 11/2008 ....... H01L 29/41766 |

*Primary Examiner* — Earl Taylor
(74) *Attorney, Agent, or Firm* — Studebaker & Brackett PC

(57) ABSTRACT

According to the present invention, a semiconductor device includes a transistor provided in a first substrate, a gate pad of the transistor, a conductive bump provided on the gate pad, a second substrate provided above the first substrate, a first electrode passing through from a first face to a second face of the second substrate and connected with the conductive bump on the second face side, a resistor connected to the first face side of the first electrode with its one end and connected to an input terminal with the other end and a second electrode provided adjacent to the first electrode on the first face and connected to the input terminal without interposing the resistor, wherein a gate leakage current of the transistor flows from the first electrode to the input terminal through a base material of the second substrate and the second electrode.

12 Claims, 11 Drawing Sheets

(56) References Cited

U.S. PATENT DOCUMENTS

| | | | | |
|---|---|---|---|---|
| 9,640,638 B2* | 5/2017 | Anderson | ............ | H01L 23/4824 |
| 2008/0265314 A1* | 10/2008 | Kobayashi | ........ | H01L 29/41766 |
| | | | | 257/330 |
| 2009/0283826 A1* | 11/2009 | Shea | .................. | H01L 29/1095 |
| | | | | 257/336 |
| 2011/0081756 A1* | 4/2011 | Kobayashi | ........ | H01L 29/41766 |
| | | | | 438/270 |
| 2012/0248582 A1* | 10/2012 | Gu | ......................... | H01L 23/29 |
| | | | | 257/632 |
| 2013/0134598 A1* | 5/2013 | Anderson | ........... | H01L 23/4824 |
| | | | | 257/773 |
| 2013/0341730 A1* | 12/2013 | Domanski | ....... | H01L 21/823892 |
| | | | | 257/379 |

* cited by examiner

SEMICONDUCTOR DEVICE

BACKGROUND OF THE INVENTION

Field

The present invention relates to a semiconductor device comprising a field effect transistor which amplifies high frequency signals.

Background

In a high frequency FET (Field Effect Transistor) using a compound semiconductor, a gate electrode and an input terminal may be connected via a resistor. This resistor is provided for the purpose of suppressing of oscillation and adjusting a gate voltage which is applied to the FET. As the temperature of the FET rises, a gate leakage current may be generated. When the gate leakage current flows the resistor connected to the gate electrode, the gate voltage applied to the FET will rise due to a voltage drop. As a result, a drain current flowing to the FET will increase, causing the FET to generate heat further. This increases the gate leakage current further. By this cascade of events, the FET may be damaged.

With regard to this, a semiconductor device having a bias circuit comprising an NIN element is disclosed in JP 11-297941 A. The NIN element is connected in parallel with a resistor which is connected between a gate bias supplying power source and a gate. The NIN element has a configuration in which a semi-insulating semiconductor layer is sandwiched between two N-type conductive contact layers. The resistance value of the NIN element decreases with the temperature rise. For this reason, as the temperature rises, the resistance value of the bias circuit decreases. At this time, even when the gate leakage current increases, the rise of gate potential is prevented. Thus, the temperature rise of the FET is inhibited.

In the semiconductor device disclosed in JP 11-297941 A, the FET and the NIN element are formed in a substrate. At this time, close arrangement of the FET and the NIN element may be limited. For this reason, even when the FET reaches high temperatures, it may be difficult to raise the temperature of the NIN element. Consequently, the rise of gate potential may not be sufficiently suppressed. Also, when a compound semiconductor having a wider band gap as compared with silicon is used for the substrate, creation of the FET which is suitable for high power operation is allowed. On the other hand, in the NIN element formed from the compound semiconductor, it may be difficult to drop the resistance, even when the temperature of the FET rises. Consequently, suppression of the rise of gate potential by the NIN element may not be sufficiently made.

Further, the area of the substrate increases due to the formation of the NIN element. This increases manufacturing costs. Also, in order to adequately retrieve FET performance, it is preferably to form a matching circuit in the proximity of the FET. However, the formation of the NIN element in the vicinity of the FET may not allow the matching circuit to be arranged in the vicinity of the FET. At this time, FET performance may be inhibited.

SUMMARY

The present invention has been implemented to solve the above-described problems and it is an object of the present invention to obtain a semiconductor device which can suppress an increase in the area of a substrate.

The features and advantages of the present invention may be summarized as follows.

According to the present invention, a semiconductor device includes a first substrate, a transistor provided in the first substrate, a gate pad provided on the upper surface of the first substrate and connected with a gate electrode of the transistor, a conductive bump provided on the gate pad, a second substrate provided above the first substrate and having a first face and a second face which is a face opposite to the first face, a first electrode passing through from the first face to the second face and connected with the conductive bump on the second face side, a resistor connected to the first face side of the first electrode with its one end and connected to an input terminal with the other end and a second electrode provided adjacent to the first electrode on the first face and connected to the input terminal without interposing the resistor, wherein the first electrode and the second electrode are spaced by a base material of the second substrate and a gate leakage current which flows from a drain electrode of the transistor to the gate electrode flows from the first electrode to the input terminal through the base material of the second substrate and the second electrode.

Other and further objects, features and advantages of the invention will appear more fully from the following description.

DESCRIPTION OF EMBODIMENTS

Figure 1:
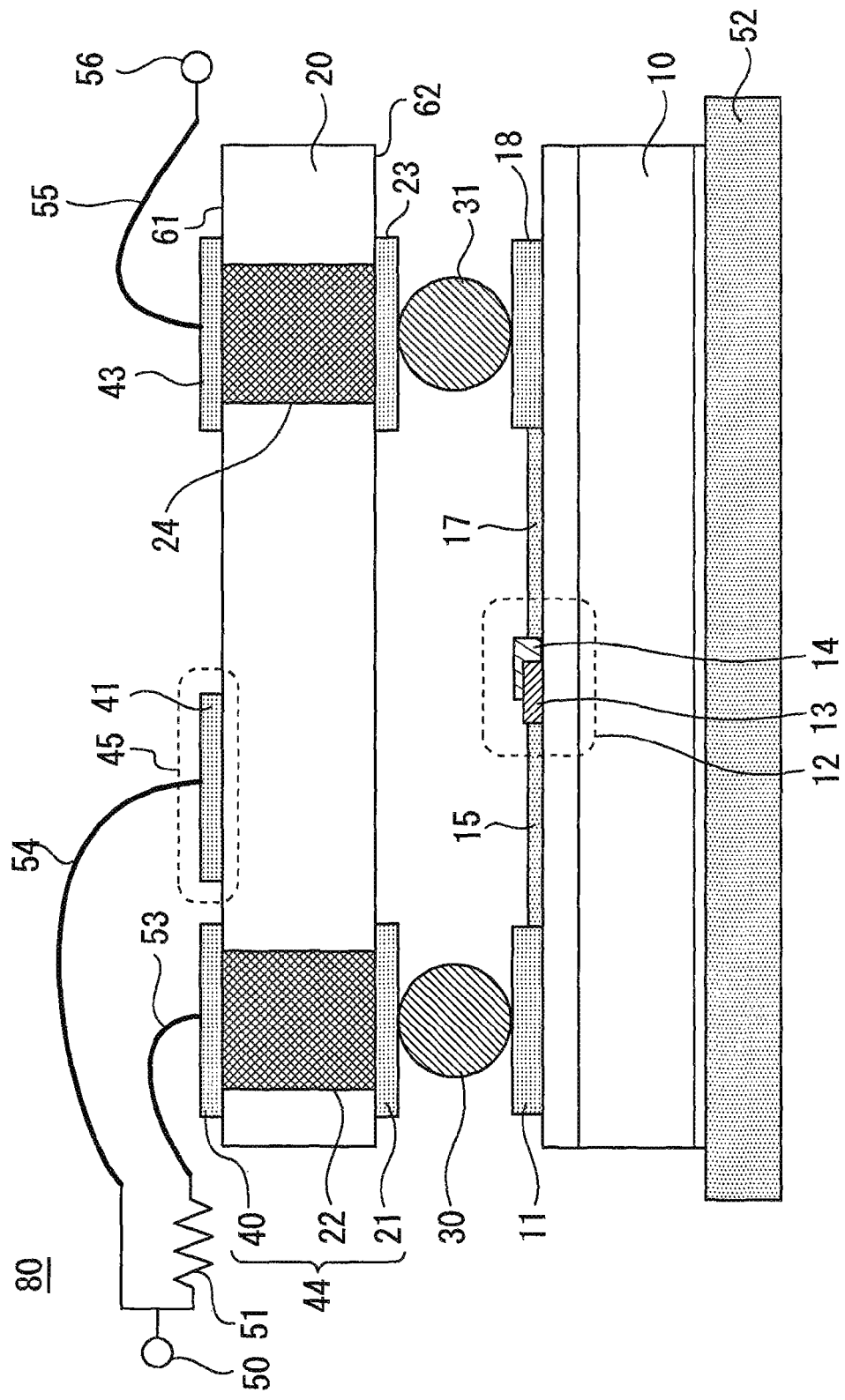
FIG. 1 is a cross sectional view of a semiconductor device according to a first embodiment.

A semiconductor device according to an embodiment of the present invention will be described with reference to the accompanying drawings. Components identical or corresponding to each other are indicated by the same reference characters, and repeated description of them is avoided in some cases.

First Embodiment

FIG. 1 is a cross sectional view of a semiconductor device according to a first embodiment. A semiconductor device 80 according to the present embodiment comprises a first substrate 10. A transistor 12 is provided in the first substrate 10. In the present embodiment, the transistor 12 is a high frequency FET. The first substrate 10 is formed from a compound semiconductor. As a material for the first substrate 10, compound semiconductors such as gallium arsenide, gallium nitride and indium phosphide are used.

A gate pad 11 is provided on the top surface of the first substrate 10. The gate pad 11 is connected to a gate electrode 13 of the transistor 12 by a wiring 15. A drain pad 18 is provided on the top surface of the first substrate 10. The drain pad 18 is connected to a drain electrode 14 of the transistor 12 by a wiring 17. A ground metal 52 is provided on the back surface of the first substrate 10. A ground potential is applied to the ground metal 52.

A conductive bump 30 is provided on the gate pad 11. Further, a conductive bump 31 is provided on the drain pad 18. For the conductive bumps 30, 31, gold, copper or solder can be used. Materials of the conductive bumps 30, 31 are not limited thereto.

A second substrate 20 is provided above the first substrate 10. The second substrate 20 has a first face 61 and a second face 62 which is a face opposite to the first face 61. The second substrate 20 is formed from silicon having resistivity of 100 Ω cm or more. Silicon which will be a material of the second substrate 20 is intrinsic silicon used for a high frequency substrate. The second substrate 20 is provided on the conductive bumps 30, 31 so that the second face 62 faces the top surface of the first substrate 10. The second substrate 20 is implemented above the first substrate 10 by the conductive bumps 30, 31.

A first electrode 44 is formed in the second substrate 20. The first electrode 44 passes through from the first face 61 to the second face 62. In addition, the first electrode 44 is connected with the conductive bump 30 at the second face 62 side. The first electrode 44 comprises a first pad 21 on the second face 62. The first pad 21 is connected with the conductive bump 30. Further, the first electrode 44 comprises a first bonding pad 40 on the first face 61. The first bonding pad 40 is a pad for making wire bonding. The first pad 21 and the first bonding pad 40 are electrically continuous by a first via hole 22 which passes through from the first face 61 to the second face 62.

The semiconductor device 80 comprises a resistor 51. The resistor 51 is connected to the first face 61 side of the first electrode 44 with its one end. The one end of the resistor 51 is connected with the first bonding pad 40 by a wiring 53. The other end of the resistor 51 is connected to an input terminal 50. Input of high frequency signals and application of a gate voltage are performed from the input terminal 50. The resistor 51 allows suppression of oscillation and adjustment of the gate voltage applied to the transistor 12.

A second electrode 45 is formed in the second substrate 20. In the present embodiment, the second electrode 45 is a second bonding pad 41 provided on the first face 61. The second electrode 45 is provided adjacent to the first electrode 44. The second electrode 45 is connected to the input terminal 50 by a wiring 54. The second electrode 45 is connected to the input terminal 50 without interposing the resistor 51.

In the present embodiment, the second electrode 45 was the second bonding pad 41 provided on the first face 61. The shape of the second electrode 45 is not limited thereto. The second electrode 45 is allowed as long as it is provided on the first face 61 and is connected to the input terminal 50 with its first face 61 side. The second electrode 45 is not connected with the other pads and the transistor 12. The second electrode 45 and the first electrode 44 are spaced by a base material of the second substrate 20. The second electrode 45 is in a floating state.

The second substrate 20 comprises a third pad 23 on the second face 62. The third pad 23 is connected with the conductive bump 31. Further, the second substrate 20 comprises a third bonding pad 43 on the first face 61. The third pad 23 and the third bonding pad 43 are connected by a third via hole 24 which passes through from the first face 61 to the second face 62. The third bonding pad 43 is connected to an output terminal 56 by a wiring 55.

Figure 2:
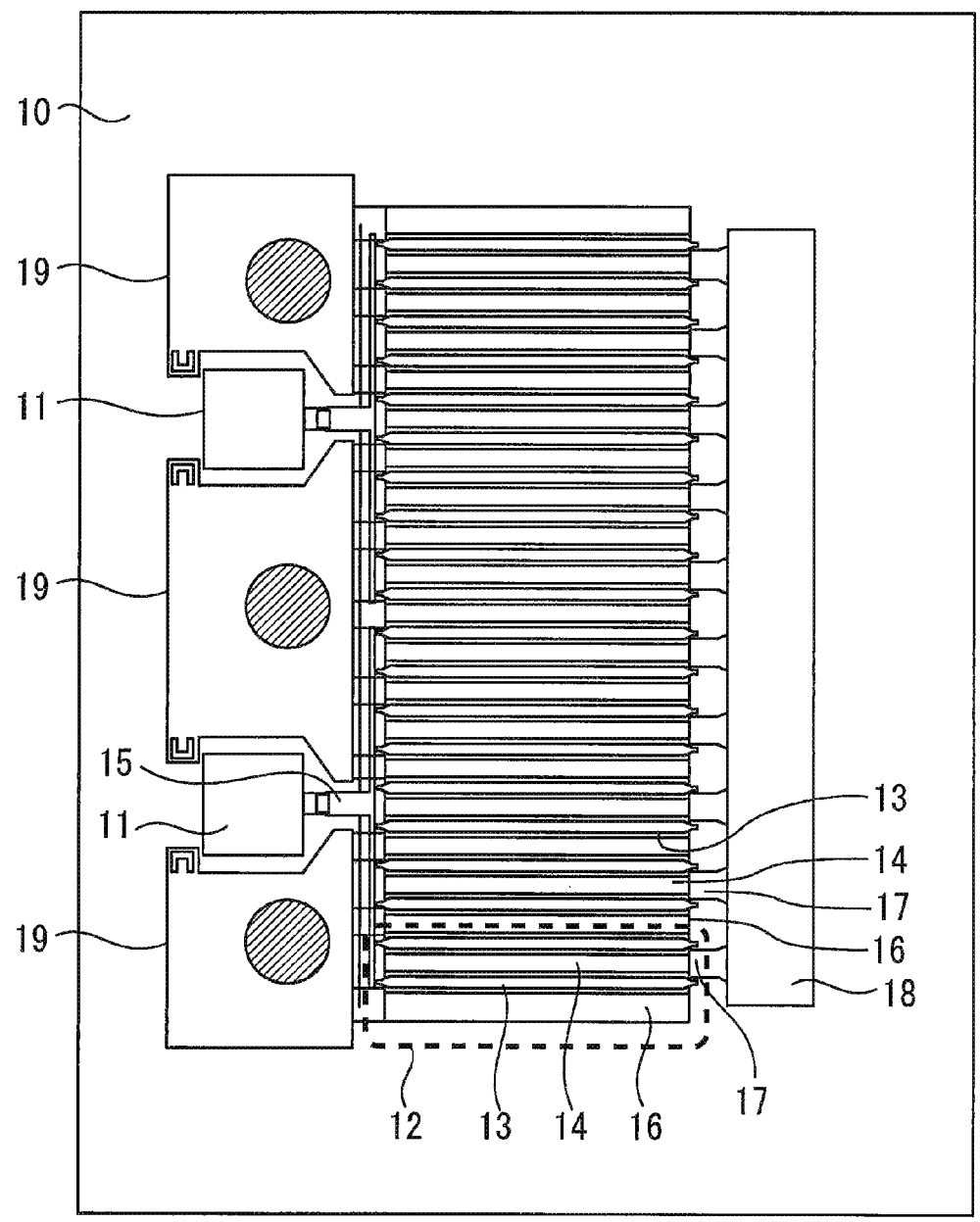
FIG. 2 is a plan view of a first substrate according to the first embodiment.

FIG. 2 is a plan view of the first substrate according to the first embodiment. The drain electrodes 14 and source electrodes 16 are alternately arranged on the top surface of the first substrate 10. The drain electrode 14 and the source electrode 16 are rectangular in the plan view. The gate electrode 13 is arranged between the drain electrode 14 and the source electrode 16. The gate pad 11 and the source pad 19 are arranged in one end of an area where the gate electrode 13, the drain electrode 14 and the source electrode 16 are positioned. The drain pad 18 is arranged in the other end of the area where the gate electrode 13, the drain electrode 14 and the source electrode 16 are positioned.

Figure 3:
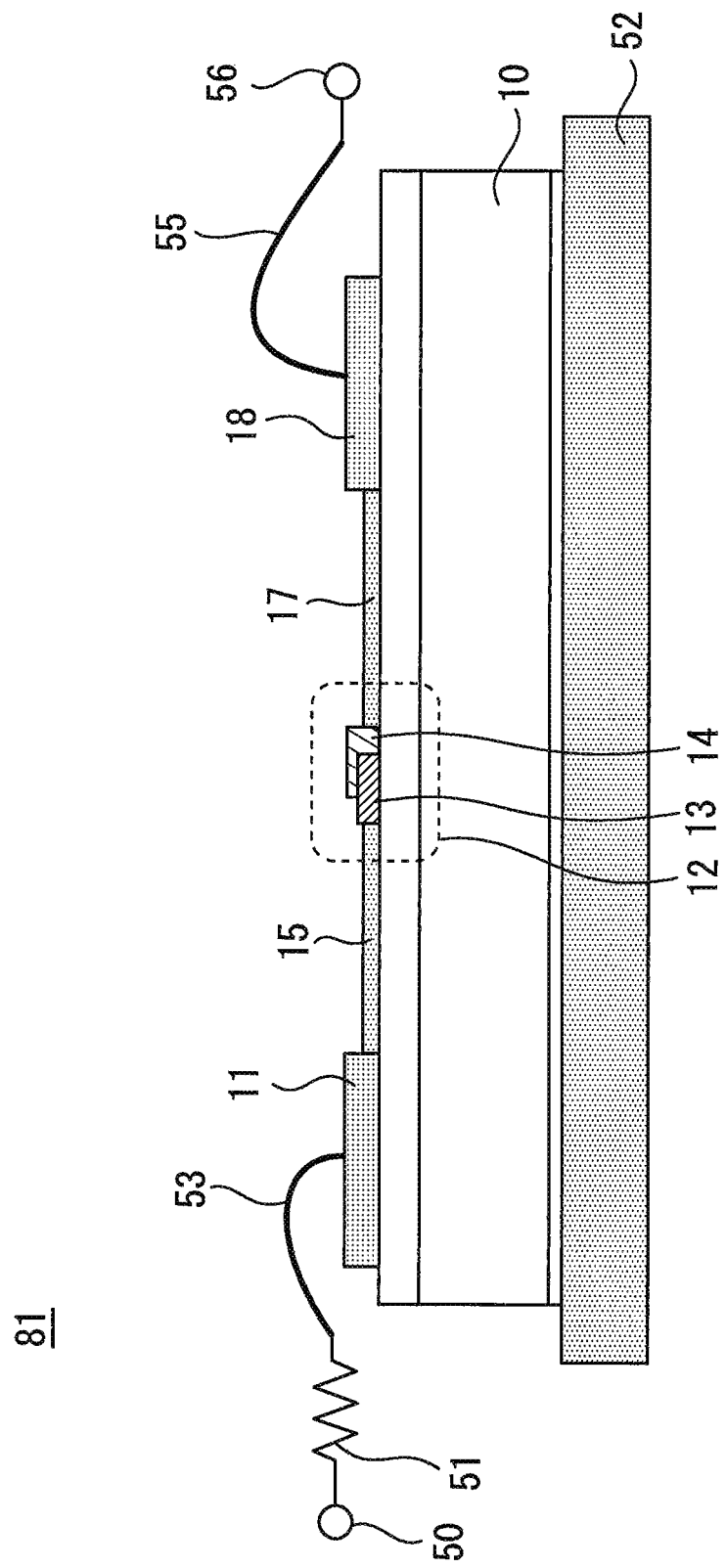
FIG. 3 is a cross sectional view of a semiconductor device according to a comparative example.

FIG. 3 is a cross sectional view of a semiconductor device according to a comparative example. A semiconductor device 81 according to the comparative example comprises the first substrate 10. The structure of the first substrate 10 is similar to that of the semiconductor 80. The semiconductor device 81 does not comprise the second substrate 20. To the gate pad 11, one end of the resistor 51 is connected via the wiring 53. To the other end of the resistor 51, the input terminal 50 is connected. The drain pad 18 is connected to the output terminal 56 via the wiring 55.

When the gate voltage is applied to the transistor 12 to make the flow of the drain current, the transistor 12 generates heat. In general, in the case of the FET formed from the compound semiconductor, when the temperature of the FET rises to a certain value or more, a gate leakage current is generated, which flows from the drain electrode 14 to the gate electrode 13. This gate leakage current passes through the gate pad 11 and flows toward the input terminal 50 via the resistor 51. When the gate leakage current flows through the resistor 51, the gate voltage which is applied to the transistor 12 is raised due to the voltage drop. As a result, the drain current flowing to the transistor 12 is increased. For this reason, the transistor 12 will generate heat further. This increases the gate leakage current more. By this cascade of events, the transistor 12 may be damaged.

With regard to this, the operation of the semiconductor device 80 according to the present embodiment will be described. When the temperature of the transistor 12 is at room temperature, the transistor 12 has a high gain. The FET which has the high gain may generate oscillation. In the present embodiment, the oscillation of the transistor 12 can be suppressed by the resistor 51 which is connected to the input terminal 50. In addition, silicon which is the base material for the second substrate 20 has low conductivity at room temperature. For this reason, no current flows between the first electrode 44 and the second electrode 45.

When the gate voltage and the high-power high frequency signals are inputted to the input terminal 50, the temperature of the transistor 12 is raised. When the transistor 12 reaches the high temperatures, the gain is decreased. At this time, the possibility that the oscillation occurs is decreased. Meanwhile, when the transistor 12 reaches high temperatures, gate leakage current is generated. The gate leakage current flows from the drain electrode 14 to the gate electrode 13, and heads toward the first electrode 44 through the gate pad 11 and the conductive bump 30.

Then, heat generated by the first substrate 10 is transmitted to the second substrate 20 via the air between the first and the second substrates 10, 20, and via the conductive bumps 30, 31. Consequently, the temperature of the second substrate 20 is raised. When the temperature of the second substrate is increased, intrinsic carriers are generated inside silicon. To this end, the conductivity of the second substrate 20 is increased. At this time, a current path is formed between the first and second electrodes 44, 45 due to the fact that the second electrode 45 is positioned adjacent to the first electrode 44.

At this point, the gate leakage current which flows from the drain electrode 14 to the gate electrode 13 will flow from the first electrode 44 to the input terminal 50 through the base material of the second substrate 20 and the second electrode 45. The gate leakage current flows from the input terminal 50 via the second electrode 45 externally. Therefore, the gate leakage current which flows in the resistor 51 is decreased, thereby suppressing the voltage drop due to the resistor 51. Because of this, the rise of the gate voltage is suppressed, resulting in further heat generation of the transistor 12 being suppressed. Thus, damage to the semiconductor device 80 due to heat generation can be avoided.

Here, the current path between the first and second electrodes 44, 45 preferably has a low resistance. This is why the second electrode 45 is arranged adjacent to the first electrode 44. The distance between the first and second electrodes 44, 45 is preferably 100 μm or less.

Also, heat generated by the first substrate 10 is transmitted to the second substrate 20 via the air between the first and the second substrates 10, 20, and via the conductive bumps 30, 31. Since air does not easily transfer heat, the temperature of the second substrate 20 is not raised to the temperature of the transistor 12. However, the height of the conductive bumps 30, 31 has generally between a few μm and a few tens of μm, and therefore the first substrate 10 and the second substrate 20 can be proximate. Thus, the temperature of the second substrate 20 can be raised enough to increase the conductivity of the second substrate 20.

The temperature of the second substrate 20 upon heat generation of the transistor 12 was calculated by a thermal analysis with the finite element method. In the thermal analysis, the distance between the first and second substrates 10, 20 were set to 10 μm. Further, the temperature of the transistor 12 when the gate leakage current flowed was set to 190 degrees Celsius. At this time, a calculated result was obtained that the temperature of the second substrate 20 reached 140 degrees Celsius or more.

Figure 4:
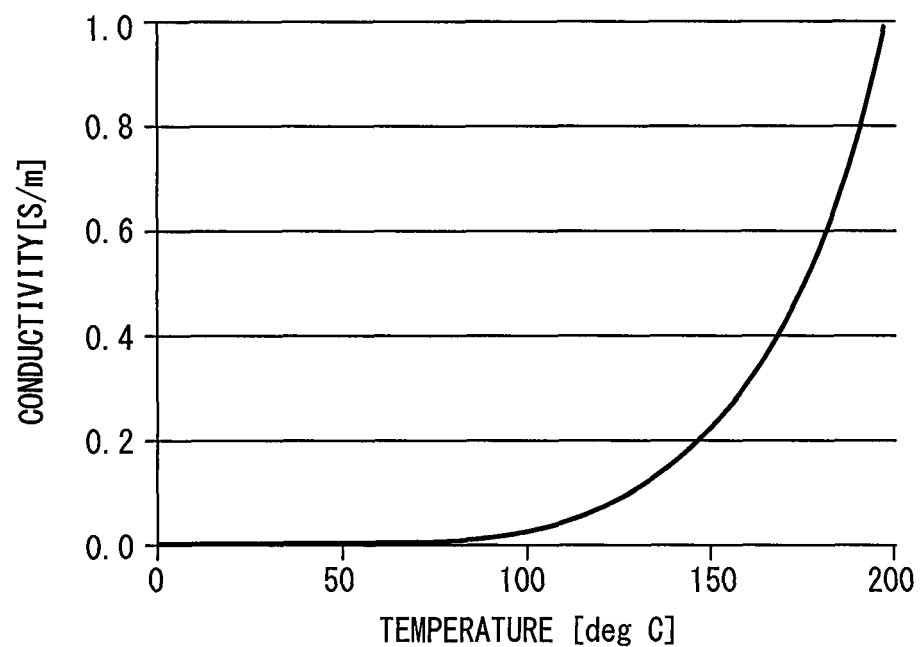
FIG. 4 is a view showing temperature characteristics of silicon conductivity.

FIG. 4 is a view showing temperature characteristics of silicon conductivity. Silicon does not have conductivity at room temperature. In silicon, intrinsic carriers are generated rapidly when its temperature exceeds 130 degrees Celsius. This results in an increase of conductivity. According to the thermal analysis, when the transistor 12 generates heat, the temperature of the second substrate 20 reaches 140 degrees Celsius. Therefore, when the transistor 12 generates heat, intrinsic carriers rapidly increase in the second substrate 20. As a result, the conductivity of the second substrate 20 increases to allow the current path to be formed between the first electrode 44 and the second electrode 45. Thus, the gate leakage current can be flowed to the second electrode 45 via silicon.

In the present embodiment, the second substrate 20 is arranged immediately above the transistor 12 of a heat generating source via conductive bumps 30, 31. The height of the conductive bumps 30, 31 can be modified. This allows the distance between the first substrate 10 and the second substrate 20 to be changed. Consequently, the temperature of the second substrate 20 can be controlled. If an increase in the conductivity of the second substrate 20 is desired, the second substrate 20 is moved close to the first substrate 10. This facilitates heat transfer from the first substrate 10 to the second substrate 20. Therefore, the temperature of the second substrate 20 is increased, causing the conductivity to increase.

In addition, also when the formation of the current path to the second electrode 45 is desired with the case that the first substrate 10 has low temperatures, the distance between the first and second substrates 10, 20 is narrowed. This facilitates heat transfer from the first substrate 10 so that the temperature of the second substrate 20 easily reaches 130 degrees or more. Consequently, when the distance between the first and second substrates 10, 20 becomes narrower, the current path to the second electrode 45 can be formed with the first substrate 10 having low temperatures. By this, the rise of the gate voltage can be suppressed, even when a FET having a property that the gate leakage current starts flowing at lower temperatures than that of normal FETs is used as the transistor 12.

Further, by changing the distance between the first and second electrodes 44, 45, a resistance value between the first and second electrodes 44, 45 can be modified. By moving the distance between the first and second electrodes 44, 45 closely, the current can be fed easily between the first and second electrodes 44, 45. In addition, in the present embodiment, the second electrode 45 was placed between the first electrode 44 and the third bonding pad 43. Positional relations between the first and second electrodes 44, 45 may be otherwise.

In the present embodiment, positional relations between the first and second electrodes 44, 45, and the distance between the first and second substrates 10, 20 can be adjusted. This allows the semiconductor device 80 to be obtained, which is adapted to characteristics of the transistor 12 such as temperatures at which the gate leakage current starts flowing.

As a method for adjusting the semiconductor device 80 which is adapted to characteristics of the transistor 12, the material of the second substrate 20 can be changed. In the present embodiment, the second substrate 20 was silicon having resistivity of 100 Ω cm or more at room temperature. By this, flowing of current into the second electrode 45 at room temperature can be prevented. When low resistivity at room temperature is not a concern, silicon having resistivity of less than 100 Ω cm can be used. Contrary to this, when high resistivity needs to be maintained until high temperatures in the second substrate 20, a wide band gap semiconductor can be used as the material of the second substrate 20.

In order to suppress the temperature rise of the transistor 12, a method for connecting a thermistor to the first substrate 10 in parallel with the resistor 51 is conceivable. However, according to this method, an area of the first substrate 10 is increased due to the formation of the thermistor.

With regard to this, the semiconductor 80 according to the present embodiment can suppress the temperature rise of the transistor 12 by providing the second substrate 20 above the first substrate 10. The conductive bumps 30, 31 which connect the first and second substrates 10, 20 are provided on the gate pad 11 and the drain pad 18, respectively. The gate pad 11 and the drain pad 18 are pads for wire bonding. The gate pad 11 and the drain pad 18 are the ones which are generally provided on a substrate.

Therefore, in the present embodiment, no new element needs to be provided to the first substrate 10 in order to suppress the temperature rise of the transistor 12. For this reason, the area of the first substrate 10 does not need to be expanded. Thus, increasing the area of the first substrate 10 can be suppressed. Specifically, a compound semiconductor substrate used in a high power FET is often expensive, as compared with a silicon substrate, and therefore, by allowing the area increase of the first substrate 10 formed from the compound semiconductor to be suppressed, manufacturing costs can be reduced.

Figure 5:
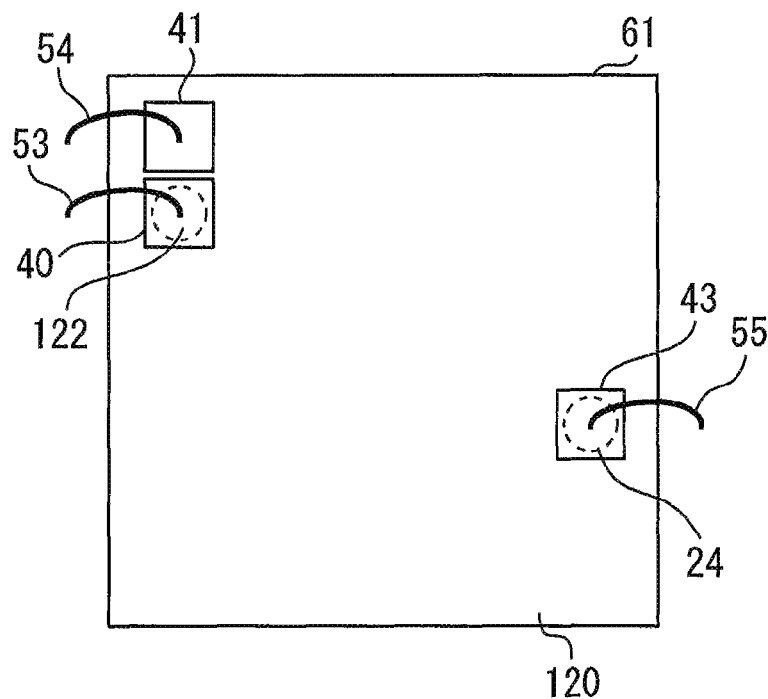
FIG. 5 is a plan view of a second substrate according to a first modification of the first embodiment.
Figure 6:
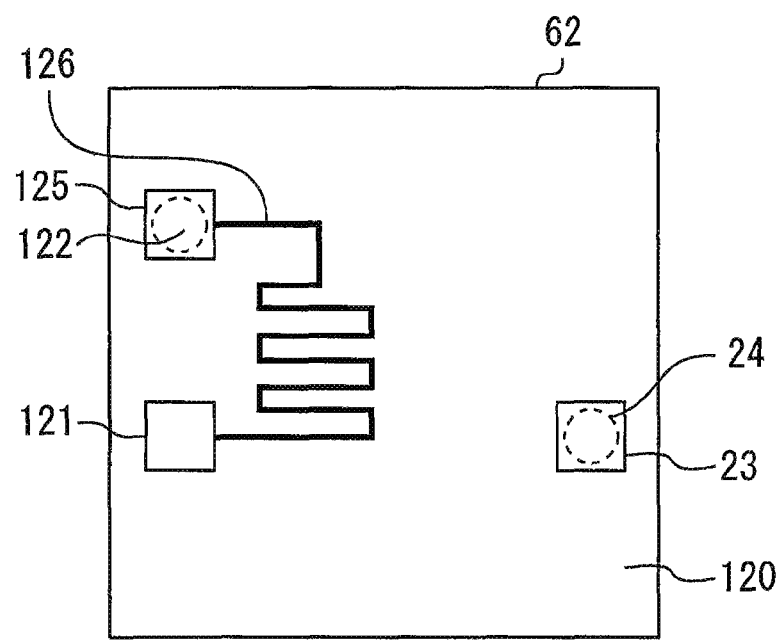
FIG. 6 is a bottom view of the second substrate according to the first modification of the first embodiment.

FIG. 5 is a plan view of a second substrate according to a first modification of the first embodiment. FIG. 6 is a bottom view of the second substrate according to the first modification of the first embodiment. As the first modification of the present embodiment, the second substrate 120 may have a function other than suppression of heat generation. For example, another circuit such as a matching circuit can be formed in the second substrate 120.

In the second substrate 120 according to the first modification, the first bonding pad 40 is provided on the first face 61. A fourth pad 125 is provided on the second face 62. The first bonding pad 40 and the fourth pad 125 are connected by a first via hole 122. Meanwhile, the position of the first via hole 122 is shown by dashed lines in FIGS. 5 and 6, for convenience. Further, in the second substrate 120 according to the first modification, the arrangement for the first, second and third bonding pads 40, 41, 43 is different from that of the second substrate 20.

In the second substrate 120 according to the first modification, a matching circuit 126 is formed on the second face 62. The matching circuit 126 is connected between the fourth pad 125 and the first pad 121. The matching circuit 126 is a meander inductor. The matching circuit 126 may be the one other than the meander inductor.

Generally, in order to make the FET high performance, the matching circuit is preferably arranged in the vicinity of the FET. On the other hand, the second substrate 120 also needs to be arranged closely to the transistor 12 so as to sense the temperature of the heat generated transistor 12. In the present embodiment, the matching circuit 126 is provided in the second substrate 120. This allows the second substrate 120 to be arranged closely to the transistor 12, along with the matching circuit 126. Thus, both effects of higher performance of the FET and suppressing damage due to heat generation can be obtained. Further, by providing the matching circuit 126 in the second substrate 120, the matching circuit does not need to be provided in the first substrate 10. Thus, the area of the first substrate 10 can be reduced. Because of this, higher integration of the FET can be implemented. A circuit for forming in the second substrate 120 is not limited to the matching circuit 126.

Figure 7:
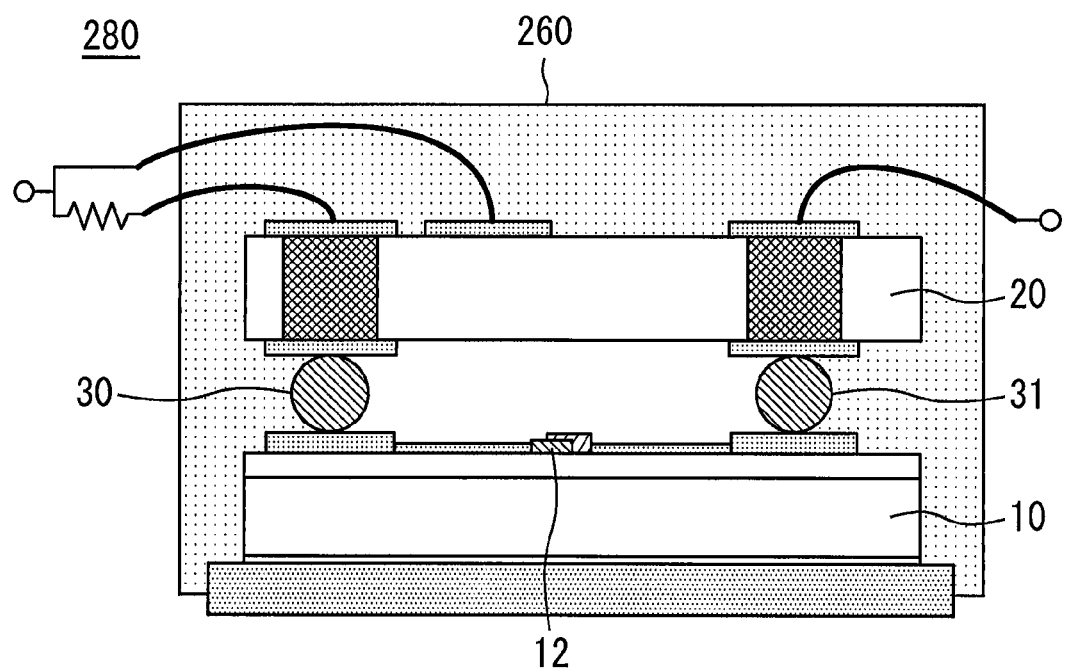
FIG. 7 is a cross sectional view of a semiconductor device according to a second modification of the first embodiment.

FIG. 7 is a cross sectional view of a semiconductor device according to a second modification of the first embodiment. In a semiconductor device 280 according to the second modification, the first and second substrates 10, 20 are sealed with a resin 260. The other structures are similar to that of the semiconductor device 80. Sealing the first and second substrates 10, 20 with the resin 260 can protect the semiconductor device 280 against impact and high humidity atmosphere. The resin 260 is epoxy resin.

Figure 8:
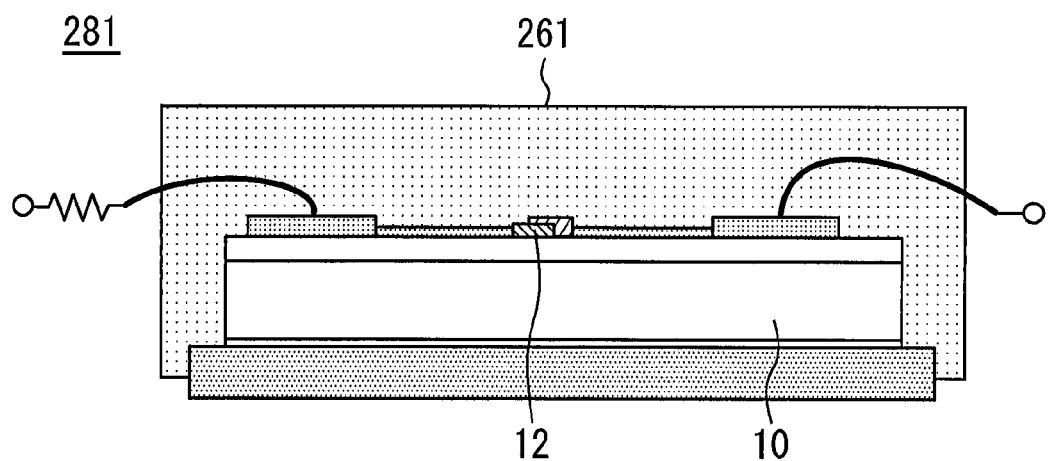
FIG. 8 is a cross sectional view of a semiconductor device according to a comparative example.

FIG. 8 is a cross sectional view of a semiconductor device according to a comparative example. In a semiconductor device 281 according to the comparative example, the first substrate 10 is sealed with a resin 261. The other structures are similar to that of the semiconductor device 81 according to the comparative example. In the semiconductor device 281 according to the comparative example, when the first substrate 10 is sealed with the resin 261, the transistor 12 contacts the resin 261. This may reduce the performance of the transistor 12.

With regard to this, in the semiconductor device 280 according to the second modification, the conductive bumps 30, 31 are provided on the first substrate 10. The second substrate 20 is provided on the conductive bumps 30, 31. To this end, a hollow region is formed on the periphery of the transistor 12. Namely, the second substrate 20 can be used as a cap for the first substrate 10. This allows the semiconductor device 280 to be sealed without reducing the performance of the transistor 12.

These modifications can be appropriately applied to semiconductor devices according to embodiments below. Meanwhile, for the semiconductor devices according to the embodiments below, dissimilarities with the first embodiment will mainly be explained as they have many similarities with the first embodiment.

Second Embodiment

Figure 9:
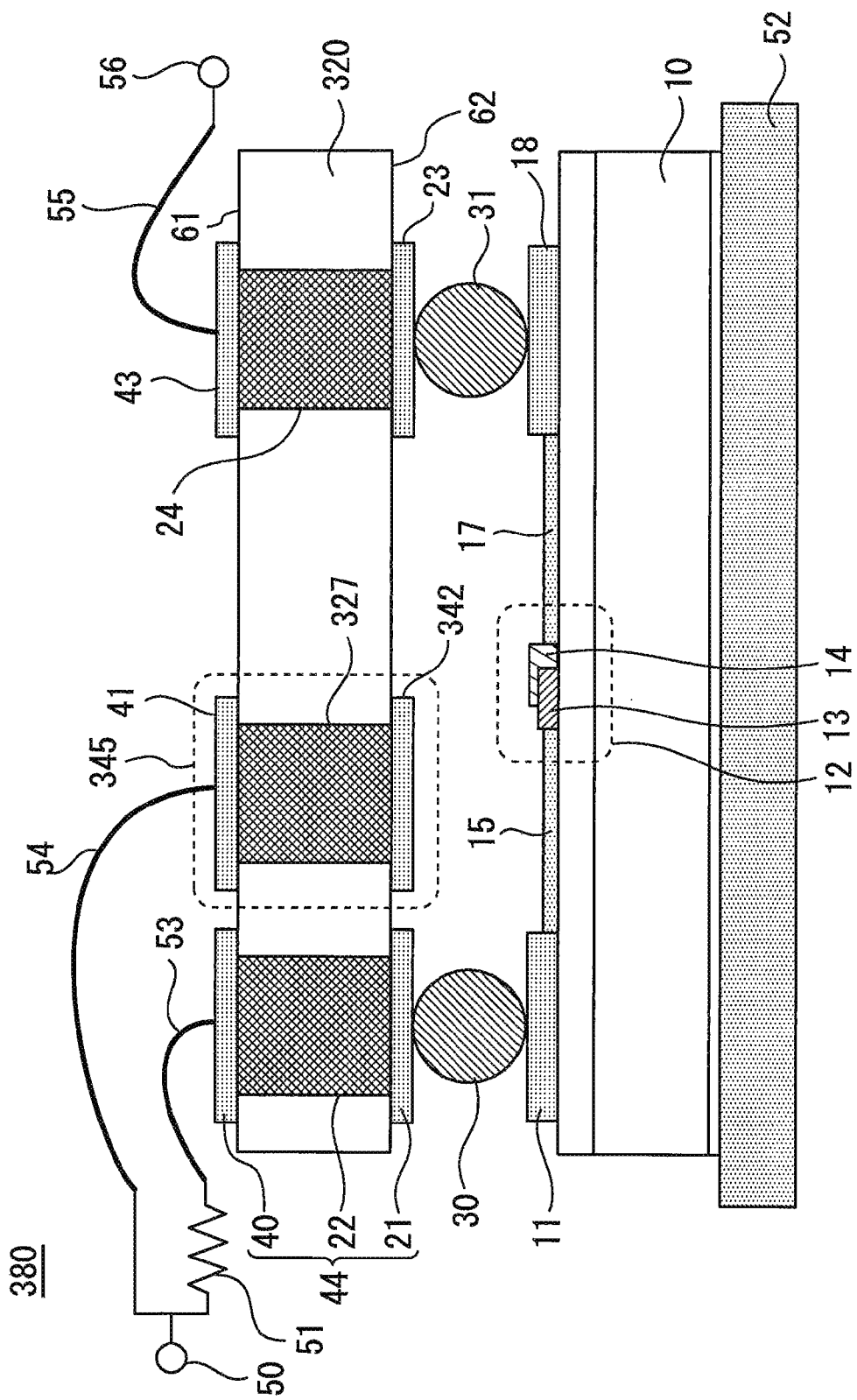
FIG. 9 is a cross sectional view of a semiconductor device according to a second embodiment.

FIG. 9 is a cross sectional view of a semiconductor device according to a second embodiment. In a semiconductor device 380 according to the present embodiment, the structure of a second electrode 345 is different from that of the semiconductor device 80. The other structures are the same as that of the first embodiment. The second electrode 345 passes through from the first face 61 to the second face 62 of a second substrate 320. The second electrode 345 comprises the second bonding pad 41 on the first face 61. Further, the second electrode 345 comprises a second pad 342 on the second face 62. The second bonding pad 41 and the second pad 342 are connected by a second via hole 327. The second electrode 345 and the first electrode 44 are spaced by a base material of the second substrate 320.

The base material of the second substrate 320 is the same as that of the second substrate 20. When the second substrate 320 reaches high temperatures, the conductivity of the second substrate 320 is raised, thereby causing the flow of the gate leakage current toward the second electrode 345. For the resistance value between the first and second electrodes 44, 345, the greater the current path has a cross sectional area, the smaller the resistance value becomes. In the present embodiment, the gate leakage current flows between the first via hole 22 and the second via hole 327. For this reason, the cross sectional area of the current path increases as compared to the first embodiment. Therefore, the resistance value between the first and second electrodes 44, 345 can be decreased more than that of the first embodiment. Because of this, a gate leakage current will be flowed toward the second electrode 345 easily. Thus, effectiveness for suppressing heat generation of the transistor 12 can be enhanced.

Third Embodiment

Figure 10:
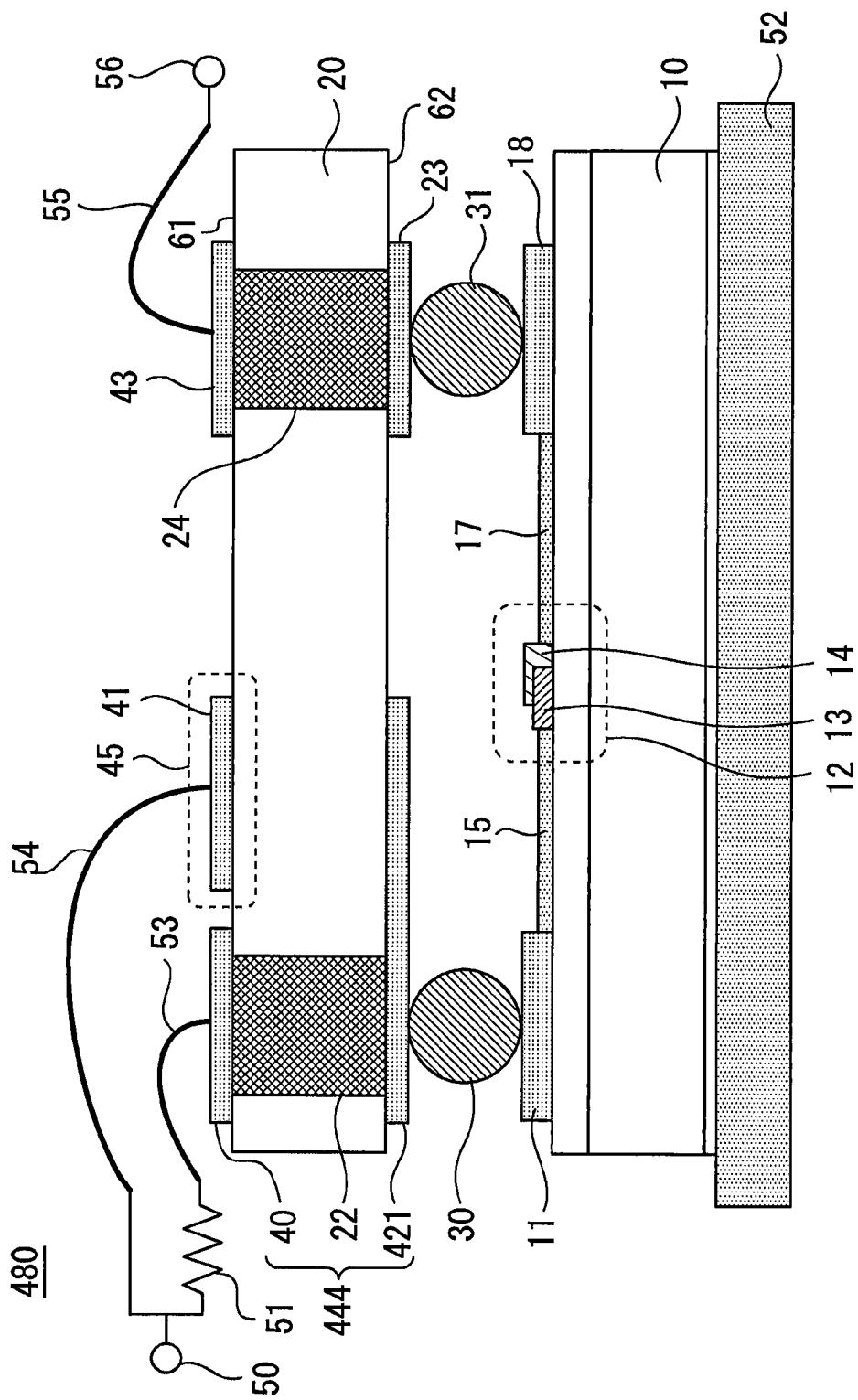
FIG. 10 is a cross sectional view of a semiconductor device according to a third embodiment.

FIG. 10 is a cross sectional view of a semiconductor device according to a third embodiment. For a semiconductor device 480 according to the present embodiment, the structure of a first electrode 444 is different from that of the semiconductor device 80. The other structures are the same as that of the first embodiment. The first electrode 444 comprises a first pad 421 connected with the conductive bump 30 and provided on the second face 62. The first pad 421 extends to just below the second bonding pad 41. The first pad 421 is formed to a position where the first pad 421 overlaps with the second bonding pad 41 in the plan view.

In the first embodiment and the second embodiment, the gate leakage current which flows between the first electrode 44 and the second electrodes, 45, 345 mainly flows to a direction parallel to the first face 61. On the contrary, in the present embodiment, the gate leakage current can be flowed in a direction from the second face 62 toward the first face 61. In the plan view, by expanding the area where the first pad 421 and the second bonding pad 41 overlap, the cross sectional area of the current path can be increased. Thus, the resistance value of the current path of the gate leakage current from the first electrode 444 to the second electrode 45 can be decreased.

Fourth Embodiment

Figure 11:
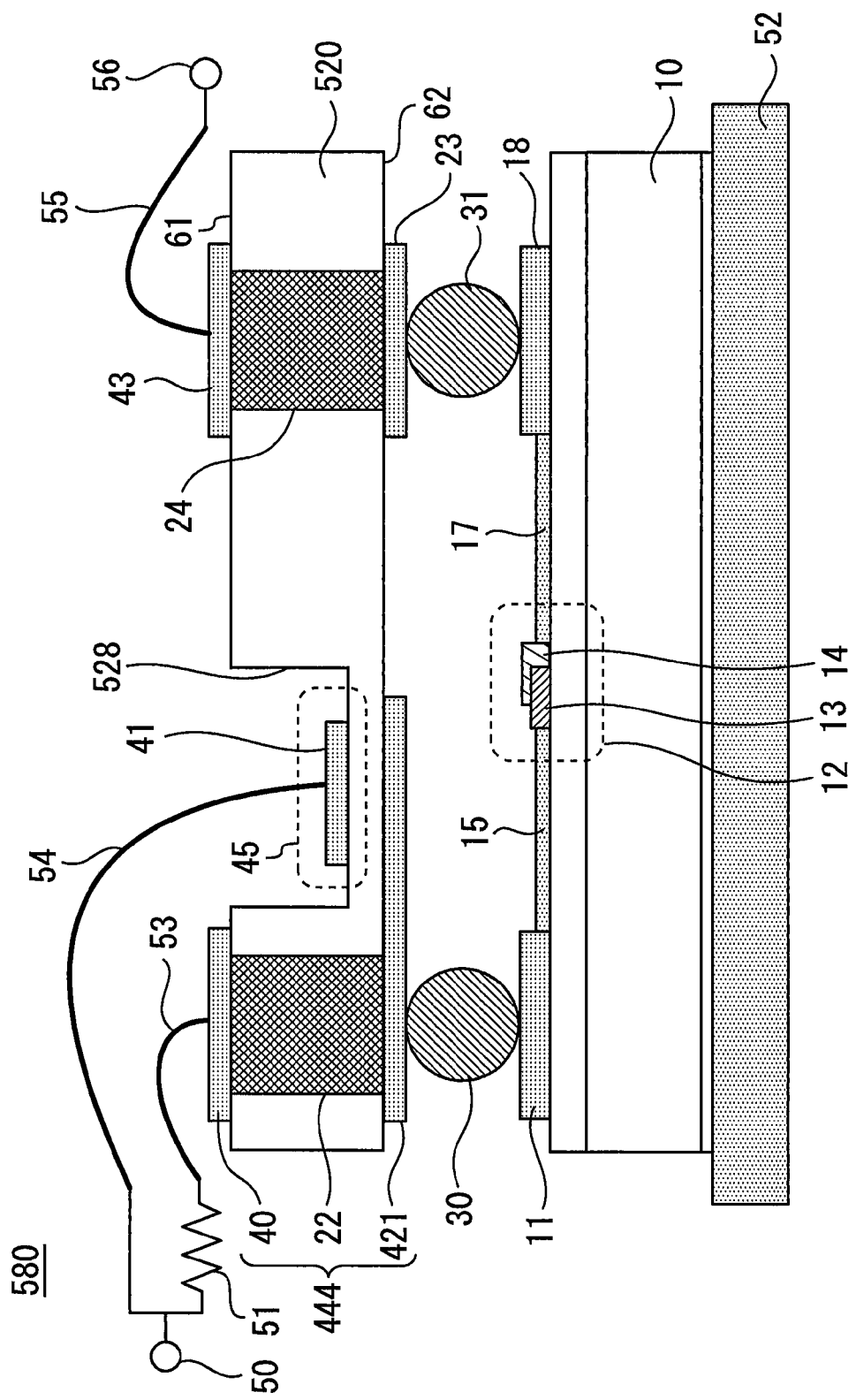
FIG. 11 is a cross sectional view of a semiconductor device according to a fourth embodiment.

FIG. 11 is a cross sectional view of a semiconductor device according to a fourth embodiment. For a semiconductor device 580 according to the present embodiment, the shape of a second substrate 520 is different from that of the third embodiment. A first recess 528 is formed in the first face 61 of the second substrate 520. The second electrode 45 is provided on the bottom surface of the first recess 528. The other shapes are the same as that of the third embodiment. The first recess 528 is formed by etching the first face 61 of the second substrate 520.

The second substrate 520 according to the present embodiment, a portion where the second bonding pad 41 is provided is thinner than its surroundings. Because of this, the distance between the first pad 421 and the second bonding pad 41 becomes smaller than that of the third embodiment. Thus, the resistance value of the current path of the gate leakage current from the first electrode 444 to the second electrode 45 can be further decreased.

Figure 12:
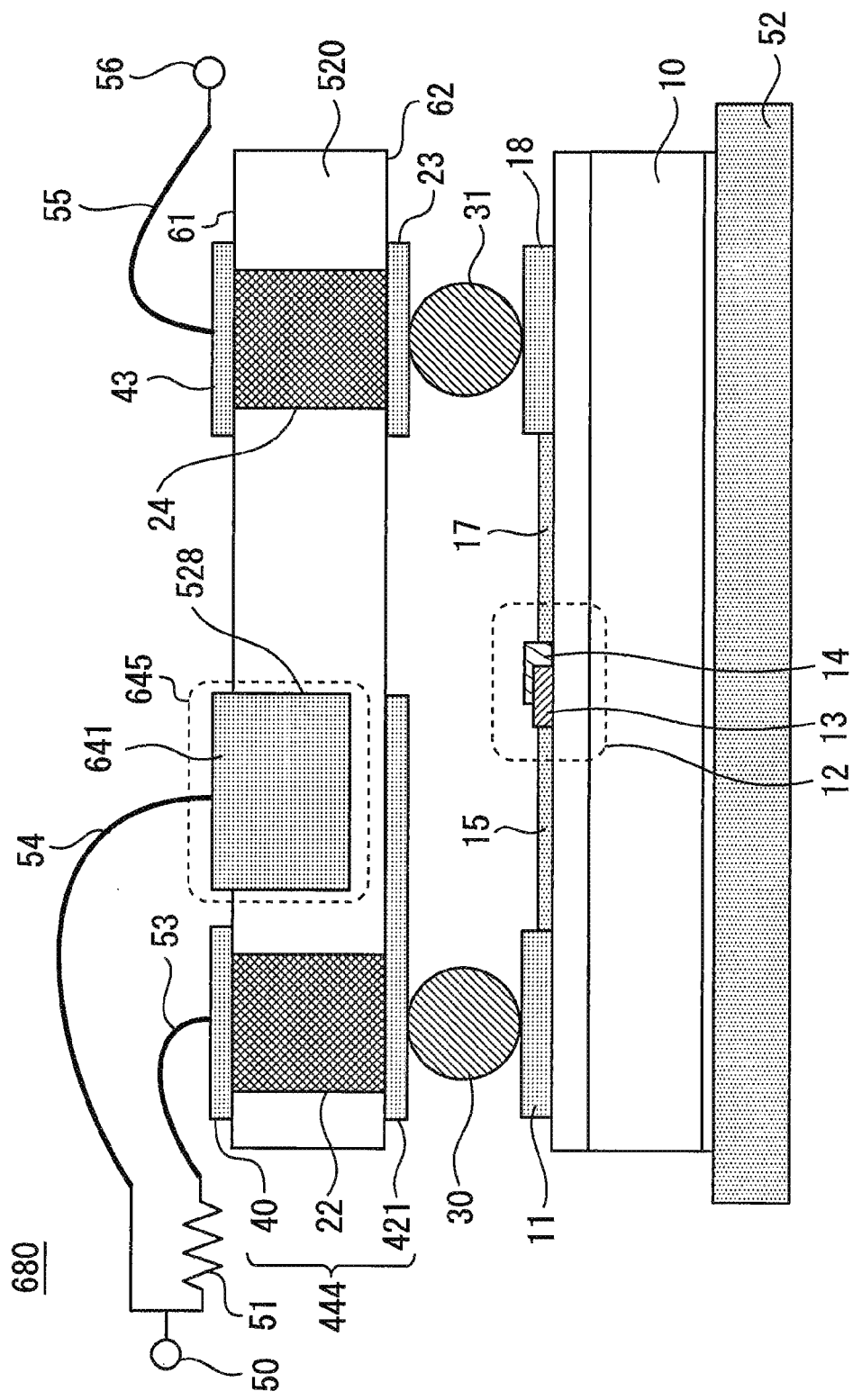
FIG. 12 is a cross sectional view of a semiconductor device according to a first modification of the fourth embodiment.

FIG. 12 is a cross sectional view of a semiconductor device according to a first modification of the fourth embodiment. In a semiconductor device 680 according to the first modification, the shape of a second electrode 645 is different from that of the semiconductor device 580. The second electrode 645 comprises a second bonding pad 641. The second bonding pad 641 is embedded in the first recess 528.

In the second substrate 520, a portion where the first recess 528 is formed is thinner than its surroundings. By filling the first recess 528 with the second bonding pad 641, the second substrate 520 can be reinforced. In addition, in the semiconductor device 580, wire bonding will be performed to the second bonding pad 41 inside the first recess 528. Contrary to this, in the semiconductor device 680 according to the first modification, the first recess 528 is filled with the second bonding pad 641. Because of this, wire bonding can be performed outside the first recess 528. Thus, wire bonding is facilitated.

Figure 13:
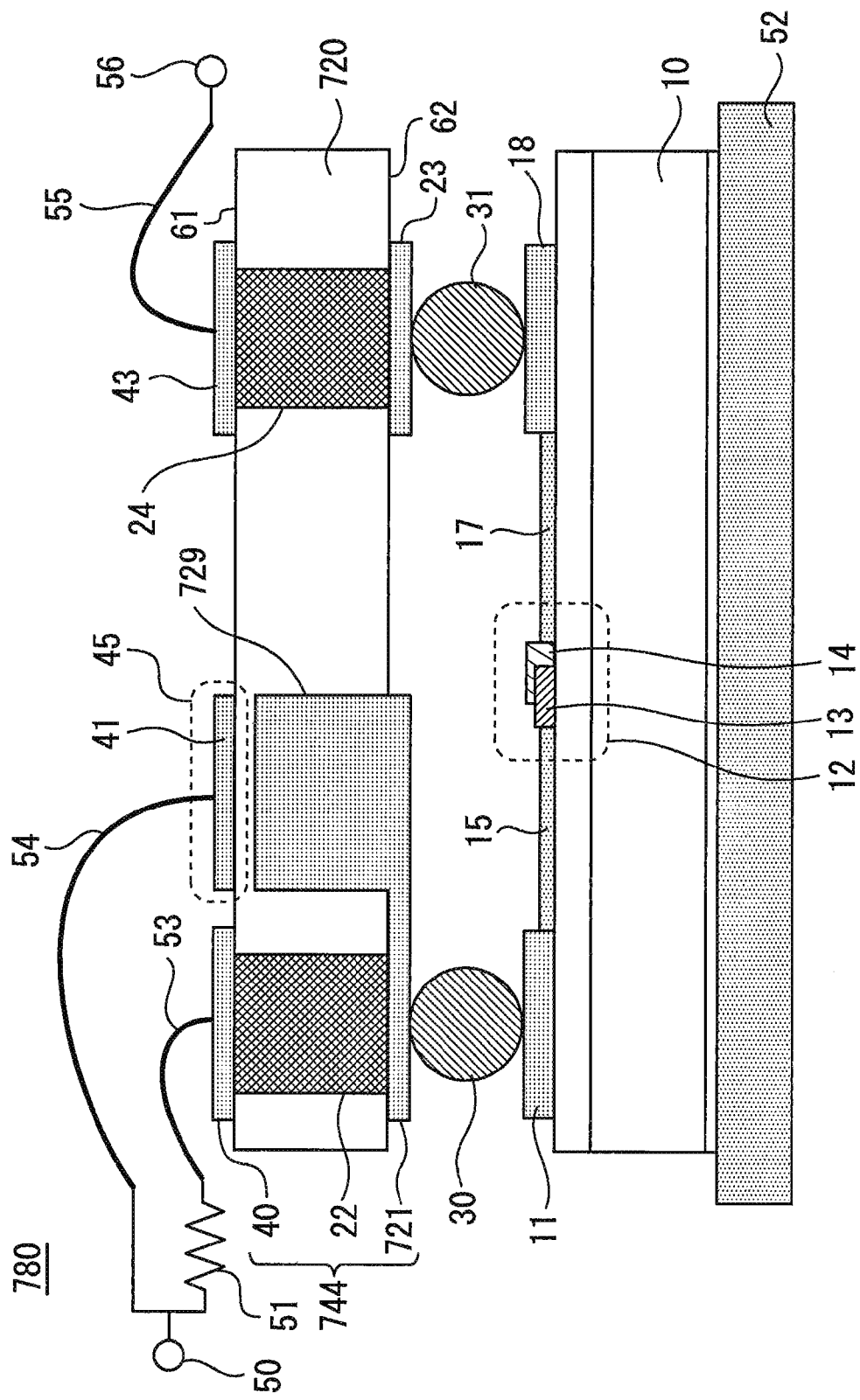
FIG. 13 is a cross sectional view of a semiconductor device according to a second modification of the fourth embodiment.

FIG. 13 is a cross sectional view of a semiconductor device according to a second modification of the fourth embodiment. For a semiconductor device 780 according to the second modification, a second recess 729 is formed in the second face 62 of the second substrate 720. The second recess 729 is formed just below the second bonding pad 41. Also, the first electrode 744 comprises a first pad 721 on the second face 62. The first pad 721 is connected with the conductive bump 30. Further, the first pad 721 is embedded in the second recess 729.

As shown in the second modification, the second recess 729 may be provided on the second face 62, and the second recess 729 may be filled with the first pad 721. Also in the second modification, a similar effect to that of the first modification can be obtained. In addition, both first and second recesses 528, 729 can be provided. Meanwhile, technical features explained in each embodiment may be appropriately combined to use.

In the semiconductor device according to the present invention, the second substrate is connected to the gate pad via the conductive bump. When the transistor generates heat, the resistance value of the base material of the second substrate is reduced. At this point, the gate leakage current which flows from the drain electrode to the gate electrode of the transistor flows from the first electrode to the second electrode through the base material of the second substrate. Therefore, the voltage drop due to the gate leakage current flowing to the first resistor can be suppressed. For this reason, heat generation of the FET is inhibited. Also, an element for inhibiting the gate leakage current does not need to be formed in the first substrate. This can suppress an increase in the area of the first substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-198125, filed on Oct. 6, 2016 including specification, claims, drawings and summary, on which the Convention priority of the present application is based, are incorporated herein by reference in its entirety.

The invention claimed is:

1. A semiconductor device comprising:
    a first substrate;
    a transistor provided in the first substrate;
    a gate pad provided on the upper surface of the first substrate and connected with a gate electrode of the transistor;
    a conductive bump provided on the gate pad;
    a second substrate provided above the first substrate and having a first face and a second face which is a face opposite to the first face;
    a first electrode passing through from the first face to the second face and connected with the conductive bump on the second face side;
    a resistor connected to the first face side of the first electrode with its one end and connected to an input terminal with the other end; and
    a second electrode provided adjacent to the first electrode on the first face and connected to the input terminal without interposing the resistor,
    wherein the first electrode and the second electrode are spaced by a base material of the second substrate, and
    a gate leakage current which flows from a drain electrode of the transistor to the gate electrode flows from the first electrode to the input terminal through the base material of the second substrate and the second electrode.

2. The semiconductor device according to claim 1, wherein the distance between the first electrode and the second electrode is 100 μm or less.

3. The semiconductor device according to claim 1, wherein the second electrode is a second bonding pad provided on the first face.

4. The semiconductor device according to claim 1, wherein the second electrode passes through from the first face to the second face.

5. The semiconductor device according to claim 3, comprising a first pad connected with the conductive bump and provided on the second face, wherein the first pad extends to just below the second bonding pad.

6. The semiconductor device according to claim 5, wherein in the second substrate, a portion where the second bonding pad is provided is thinner than its surroundings.

7. The semiconductor device according to claim 6, wherein a first recess is formed in the first face, and the second bonding pad is embedded in the first recess.

8. The semiconductor device according to claim 6, wherein in the second face, a second recess is formed just below the second bonding pad, and the first pad is embedded in the second recess.

9. The semiconductor device according to claim 1, wherein the base material of the second substrate is silicon having resistivity of 100 Ω cm or more.

10. The semiconductor device according to claim 1, wherein a matching circuit is formed in the second substrate.

11. The semiconductor device according to claim 1, wherein the first substrate and the second substrate are sealed with resin.

12. The semiconductor device according to claim 1, wherein the first substrate is formed from a compound semiconductor.

\* \* \* \* \*